US008354832B2

(12) United States Patent
Wang et al.

(10) Patent No.: US 8,354,832 B2
(45) Date of Patent: Jan. 15, 2013

(54) POWER SUPPLY NOISE INJECTION

(75) Inventors: Shujiang Wang, Shandong (CN); Joseph Anidjar, Asbury, NJ (US); Shawn M. Logan, Andover, MA (US); Chunbing Guo, Holmdel, NJ (US); HaoQiong Chen, Shanghai (CN)

(73) Assignee: LSI Corporation, Milpitas, CA (US)

( * ) Notice: Subject to any disclaimer, the term of this patent is extended or adjusted under 35 U.S.C. 154(b) by 360 days.

(21) Appl. No.: 12/824,774

(22) Filed: Jun. 28, 2010

(65) Prior Publication Data

US 2011/0316504 A1 Dec. 29, 2011

(51) Int. Cl.
*G05G 1/56* (2008.04)
*H03G 1/04* (2006.01)

(52) U.S. Cl. ......................... 323/349; 323/274; 327/551

(58) Field of Classification Search .................. 323/273, 323/274, 275, 349, 370, 280, 352; 327/551, 327/552
See application file for complete search history.

(56) References Cited

U.S. PATENT DOCUMENTS 6,304,131 B1 * 10/2001 Huggins et al. ............... 327/538
7,589,507 B2 * 9/2009 Mandal ......................... 323/273

* cited by examiner

*Primary Examiner* — Gary L Laxton
(74) *Attorney, Agent, or Firm* — Luedeka Neely Group, P.C.

(57) ABSTRACT

A method for reducing noise in an output of a voltage regulator at frequencies above a closed loop bandwidth, by providing a noise injection path for injecting external noise into the voltage regulator, where the noise injection path becomes active at the frequencies above the closed loop bandwidth, where the noise injection path reduces the noise in the output of the voltage regulator.

12 Claims, 7 Drawing Sheets

POWER SUPPLY NOISE INJECTION

FIELD

This invention relates to the field of integrated circuits. More particularly, this invention relates to the design of analog linear regulators, such as for use in system-on-chip integrated circuits.

INTRODUCTION

When designing an integrated circuit containing both analog circuits and digital circuits, one concern is the impact of random switching of the digital circuits on the performance of the analog circuits, such as voltage controlled oscillators and analog to digital converters. The amplitude of such power supply noise can be in the hundreds of millivolts, and the frequency range can be in the hundreds of megahertz, even up to the gigahertz range. Therefore, when digital circuits are placed in proximity to analog circuits to achieve high levels of integration, some type of power regulation is typically used to isolate the analog circuits from the power supply noise.

In some cases, the analog circuits are provided with an internally-generated voltage from an on-chip voltage regulator to minimize the impact of the digitally-induced supply noise. The voltage regulator derives its supply voltage from an external power supply with an output voltage that is greater than the desired output voltage of the regulator. It is desirable that such regulator circuits have a high power supply rejection ratio over a wide frequency range, be stable, and reject power supply noise without the aid of off-chip capacitors.

In current 45 nanometer CMOS technology, the external power supply voltage for core devices is about 0.90 volts. To save power, a nominal external supply voltage of about 1.2 volts is available for linear regulators. In such a system, the dropout voltage, or the difference between the regulator power supply voltage and its output voltage, is about three hundred millivolts. In a worst-case design condition, the external regulator supply voltage can be as low as about 1.08 volts, and the regulator output voltage might be as high as about 0.95 volts, corresponding to a dropout voltage of only about 130 millivolts.

In CMOS technology, two topologies of on-chip voltage regulators are typically used. One type uses an NMOS transistor between the external supply voltage of the regulator and the output voltage of the regulator, and the other type uses a PMOS device. In both cases, the device between the external supply voltage of the regulator and the output voltage of the regulator is termed the "pass device." Hence, the former topology uses an NMOS pass device and the latter a PMOS pass device.

FIG. 1 depicts a prior art regulator circuit that uses an NMOS transistor M1 as the pass device. In this design, the maximum error amplifier output voltage, $V_1$, is (VDD−Vdsat) where Vdsat is the voltage required to keep the error amplifier operating in its linear mode of operation. Therefore, the maximum regulator output voltage Vout=(VDD−Vdsat)−VTH1, where VTH1 is the threshold voltage of pass transistor M1.

To get a higher regulator output voltage, a native NMOS transistor could be used as the pass device. Because the threshold voltage of a native NMOS transistor is typically about zero volts, the regulator's output voltage can be as high as VDD−Vdsat. It can be assumed that Vdsat=100 millivolts. Since VDD is as low as about 1.08 volts, utilizing a native device with a threshold voltage of about zero, the maximum achievable regulator output voltage is VDD−Vdsat=1.08−0.1=0.980 volts. Because variations in silicon processing will produce native NMOS devices with threshold voltages greater than about 80 millivolts, this analysis indicates that this design is not able to regulate a 1.2 volt power supply down to the required output regulator voltage of 0.9 volts in cases where the externally supplied regulator voltage is as low as 1.08 V.

FIG. 2 depicts a prior art regulator circuit that uses a PMOS transistor, M2, as the pass device. Since the output voltage is limited to VDD−Vdsat2 and the error amplifier output voltage can be as low as Vdsat, this circuit can regulate a 1.2 volt external power supply whose minimum value is 1.08 volts down to as low as 1.08−0.1=0.98 volts. Therefore, this topology can meet the 0.90 volts regulator voltage output requirement. However, due to the very low voltage required of the error amplifier and the relatively large capacitance between the external supply voltage and the regulator output voltage of a PMOS pass device, the power supply rejection ratio of this design is generally not good, especially at the middle to high frequency range where its power supply rejection ratio can be greater than zero decibels (when using the convention selected for the present discussion), which makes the regulator circuit act as a noise amplifier rather than a noise suppresser.

FIG. 3 depicts a prior art PMOS-type low dropout regulator. It consists of an error amplifier, a PMOS pass transistor, and a stability compensation network comprised of Rcomp and Ccomp. This regulator design works relatively well at low frequencies, but when the power supply noise frequency is higher than the error amplifier's bandwidth, the feedback loop loses its ability to suppress the external power supply noise. FIG. 4 depicts this phenomenon in the peak at about 100 megahertz. In FIG. 4, the regulator's maximum rejection of noise on its external supply voltage is about negative four decibels. If the on-chip decoupling capacitor on the external regulator voltage is reduced to a value less than the value used in FIG. 4, the maximum rejection could be even greater than zero decibels.

Thus, the peak power supply rejection ratio is caused by the limited bandwidth of the error amplifier. When the frequency of the external regulator supply noise exceeds the closed loop bandwidth of the on-chip regulator, the gate of the pass transistor does not vary in such a fashion as to cancel the effect of the external regulator supply noise on its output voltage.

What is needed, therefore, is a regulator circuit that overcomes problems such as those described above, at least in part.

SUMMARY OF THE CLAIMS

The above and other needs are met by a method for reducing noise in an output of a voltage regulator at frequencies above a closed loop bandwidth, by providing a noise injection path for injecting external noise into the voltage regulator, where the noise injection path becomes active at the frequencies above the closed loop bandwidth, where the noise injection path reduces the noise in the output of the voltage regulator.

In various embodiments according to this aspect of the invention, the noise injection path is a capacitor. In some embodiments the noise is in-phase noise. In some embodiments the voltage regulator is a linear regulator. In some embodiments the noise is injected into a gate of a pass transistor of the voltage regulator. In some embodiments the noise injection path is a capacitor to inject in-phase noise into the voltage regulator. In some embodiments the voltage regulator is a linear regulator and the noise injection path is a capacitor to inject in-phase noise into a gate of a pass transistor of the voltage regulator.

According to another aspect of the invention there is described a method for reducing noise in an output voltage of a power supply by injecting in-phase noise into a gate of a pass transistor of a linear regulator, thereby causing source and gate voltages of the pass transistor to vary at a common phase and cancel each other out.

According to yet another aspect of the invention there is described a voltage regulator having circuitry that injects in-phase noise into a gate of a pass transistor of the voltage regulator, thereby causing source and gate voltages of the pass transistor to vary at a common phase and cancel each other out. In various embodiments according to this aspect of the invention, the circuitry is a capacitor and the voltage regulator is a linear regulator.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

To improve the regulator's power supply rejection ratio performance, a new design is employed, which is referred to herein as power supply noise injection.

If the external regulator supply noise is applied directly to the gate of the pass transistor, and the source voltage is at the external supply voltage, then the resulting difference in pass transistor gate source voltage at the external supply noise frequency is zero. Thus, the change in output voltage of the regulator due to the external supply noise frequency is also zero, because the gate-source voltage of the pass device is constant.

Figure 5:
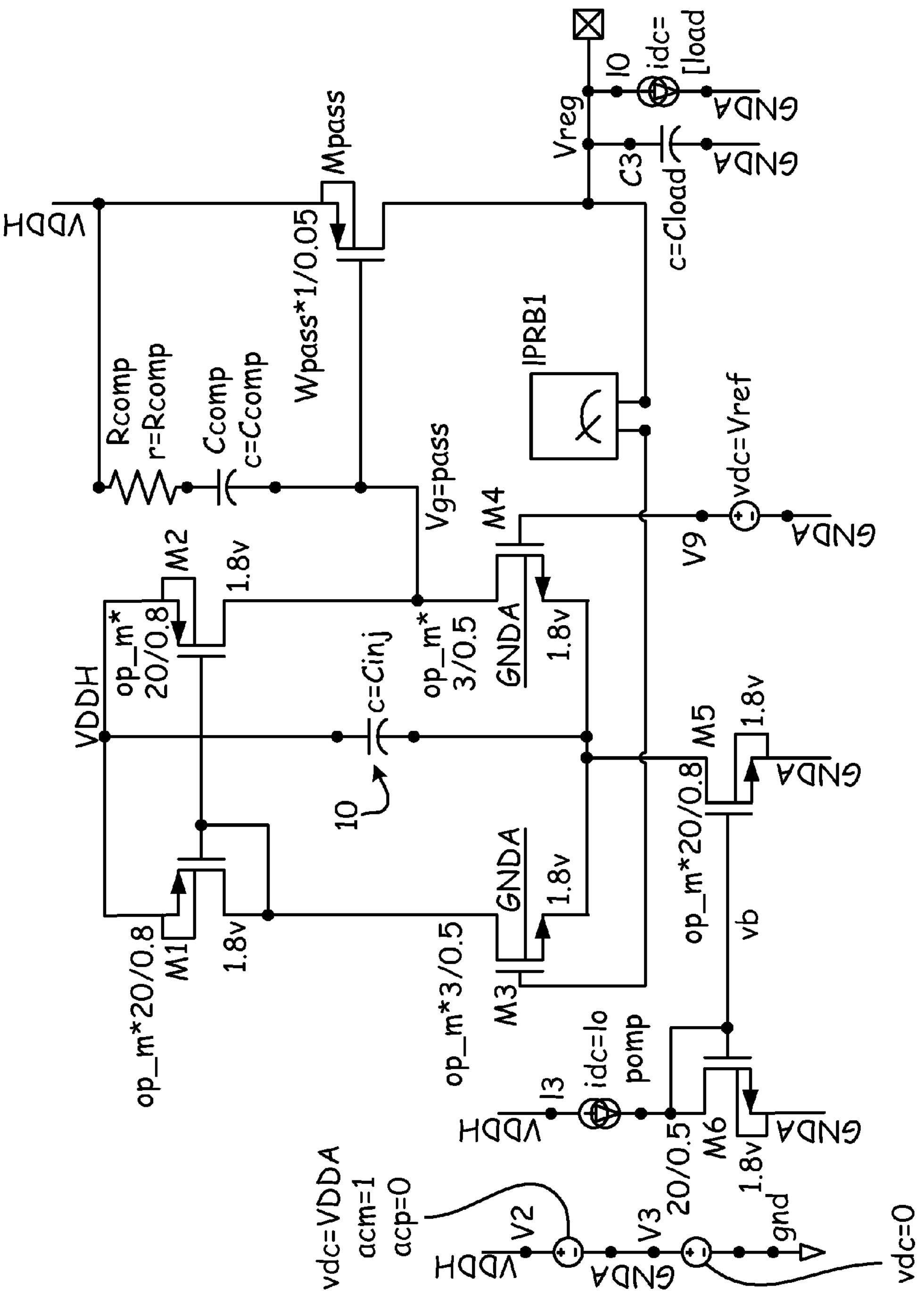
FIG. 5 is a schematic diagram of a PMOS-type pass transistor low-dropout voltage regulator according to an embodiment of the present invention.

To achieve this performance, the external power supply noise is introduced into a node of the regulator so as to appear at the gate of the PMOS pass transistor Mpass in-phase with the externally supply noise at the source of the PMOS pass transistor Mpass. In the embodiment depicted in FIG. 5, capacitor Cinj (indicated at reference character 10) is nearly a short circuit for frequencies above the regulator bandwidth. Thus, the supply noise at high frequencies on the regulator external supply is directly injected into the source of n-channel devices M3 and M4.

Figure 6:
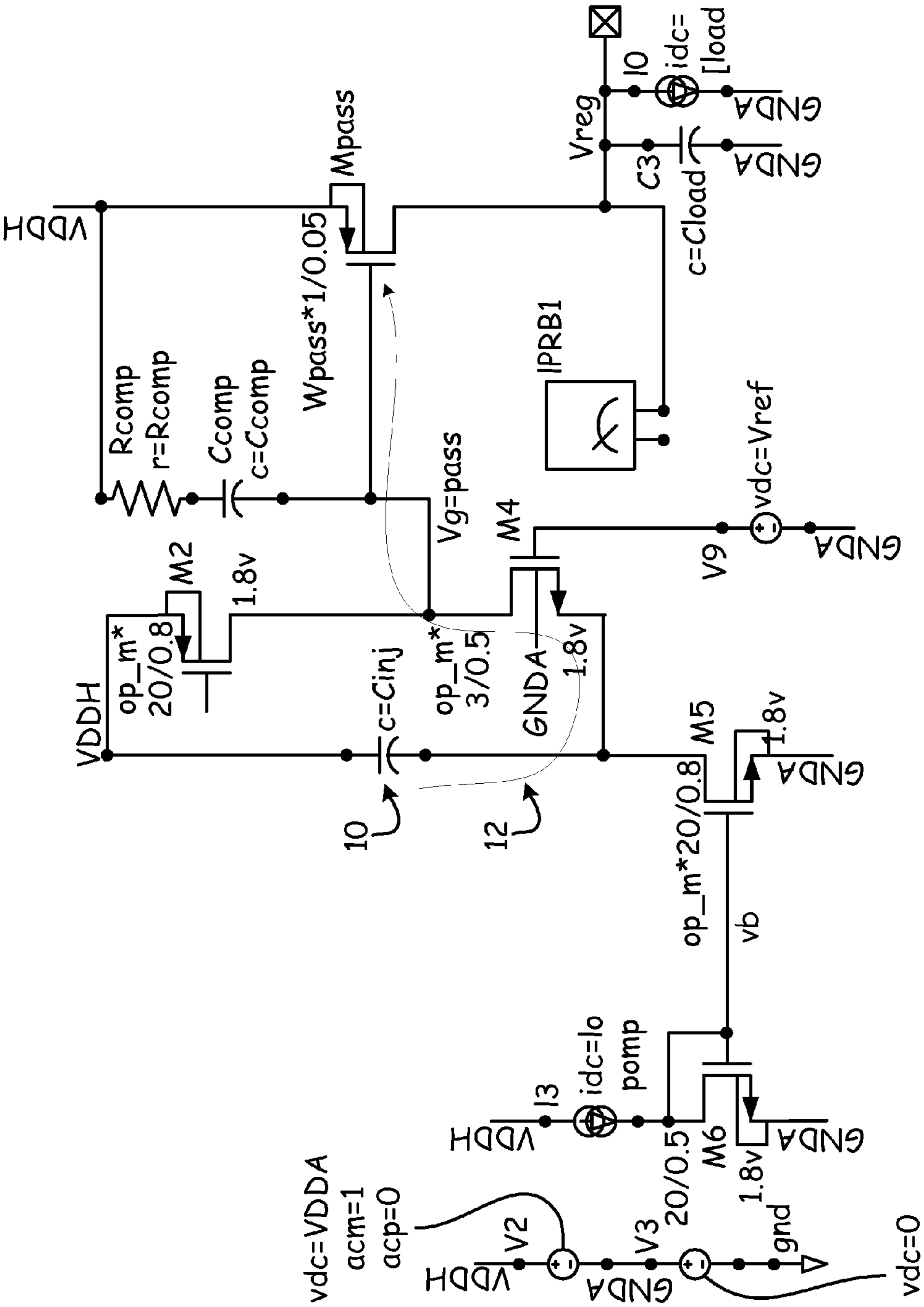
FIG. 6 is a schematic diagram of a high frequency equivalent circuit for the PMOS-type pass transistor low-dropout voltage regulator of FIG. 5, according to an embodiment of the present invention.

At high frequencies, device M4 is configured as a common gate amplifier and provides a voltage gain of unity between its source and drain terminals. The current mirror connected to the drains of devices M3 and M4 is not effective at high frequencies. Therefore, the external supply voltage noise is applied directly to the gate of the PMOS pass device Mpass, as shown by path 12 in the high frequency equivalent circuit of the regulator of FIG. 6. If in-phase noise is injected into the gate of the pass transistor Mpass, then the source and gate voltage of the pass transistor Mpass will vary at the same phase and cancel each other out. In this manner, the regulator's power supply rejection ratio can be improved.

Figure 1:
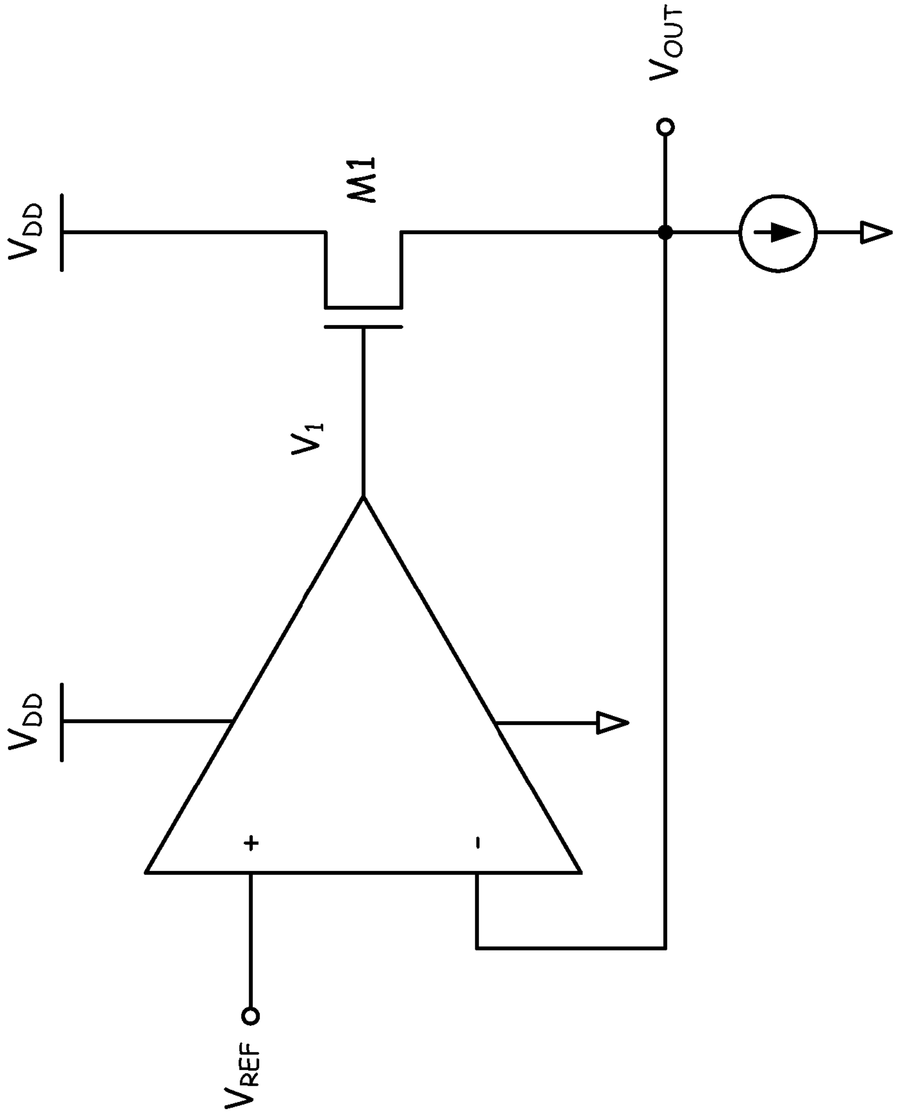
Fig. 1 (Prior Art)
FIG. 1 is a schematic diagram of a prior art linear voltage regulator using an NMOS-type pass transistor.
Figure 2:
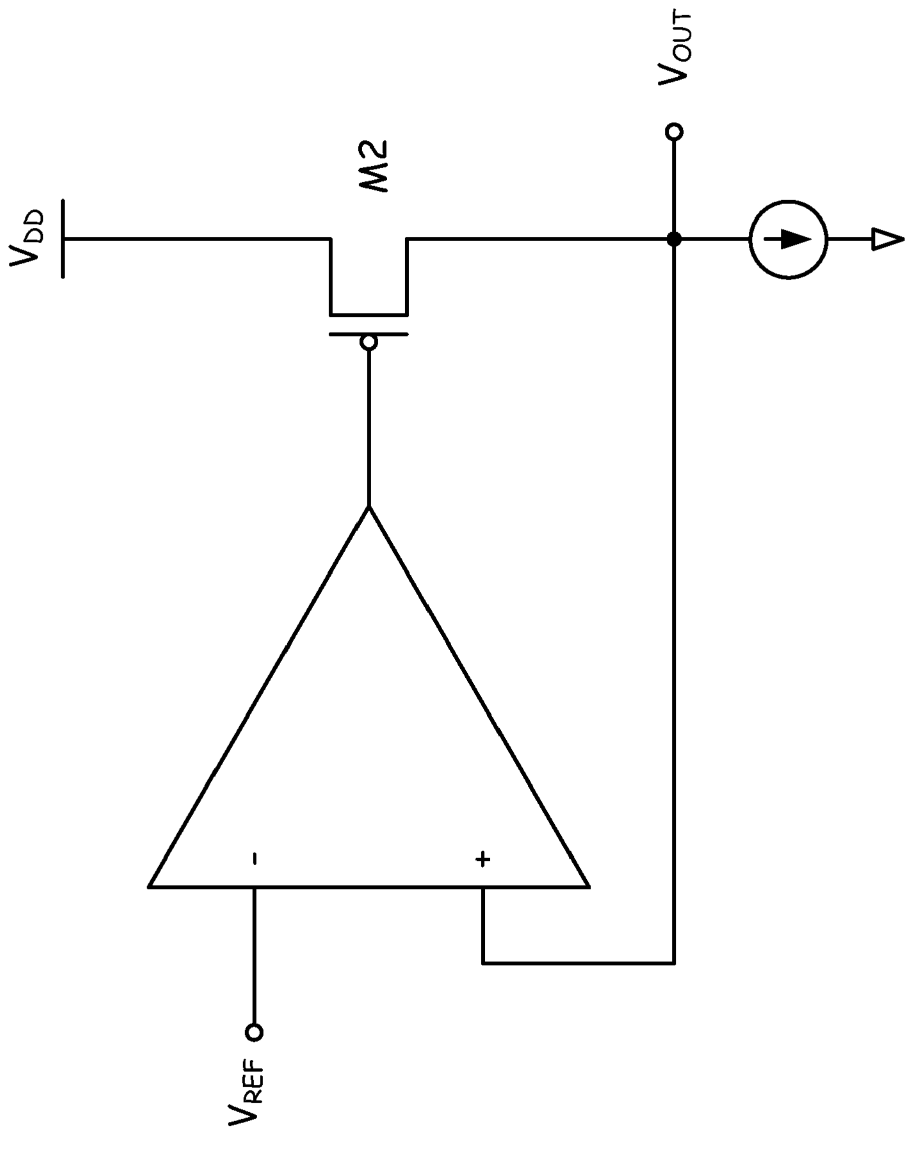
Fig. 2 (Prior Art)
FIG. 2 is a schematic diagram of a prior art linear voltage regulator using a PMOS-type pass transistor.
Figure 3:
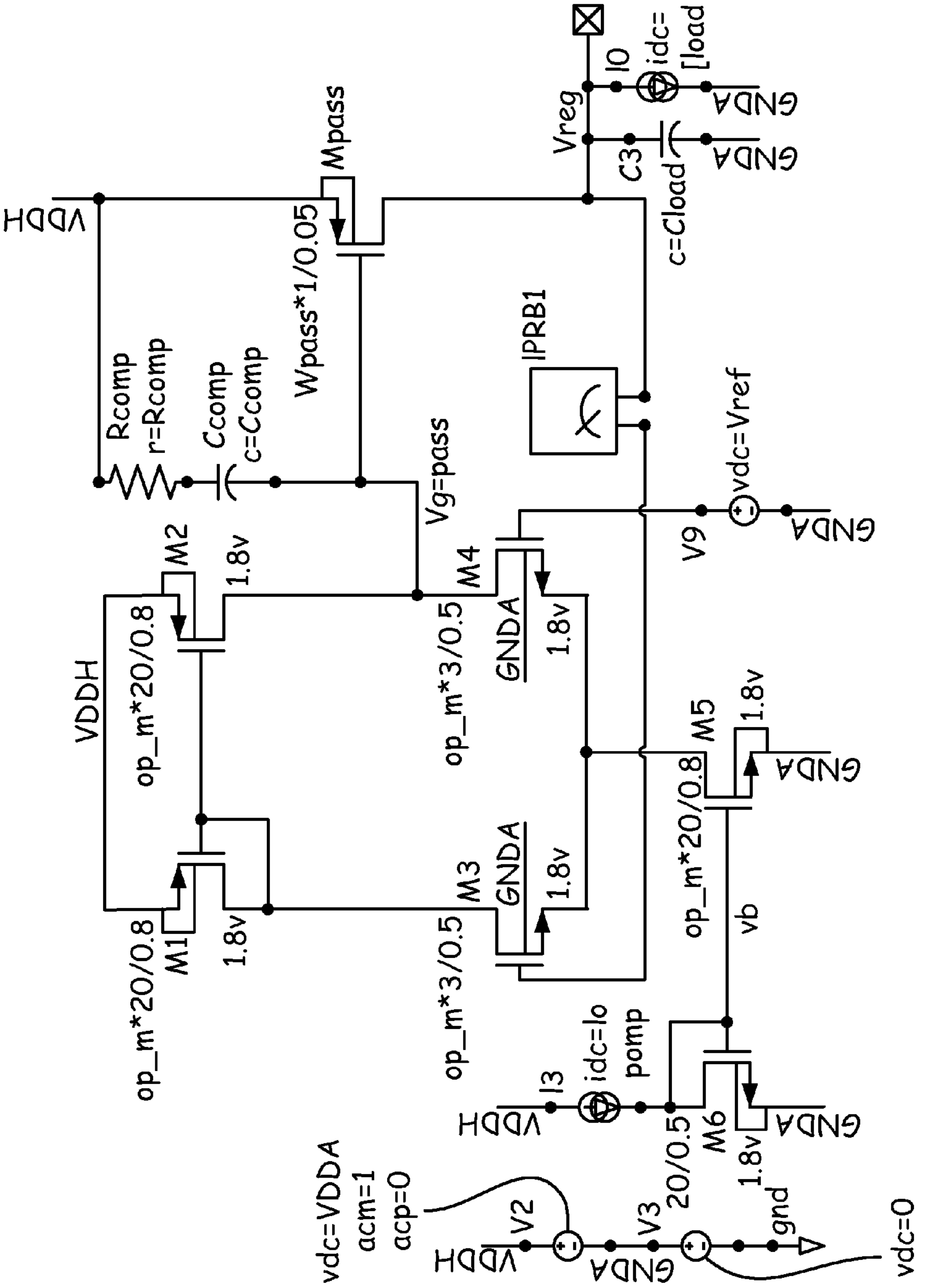
Fig. 3 (Prior Art)
FIG. 3 is a schematic diagram of a prior art PMOS-type pass transistor low-dropout voltage regulator.
Figure 4:
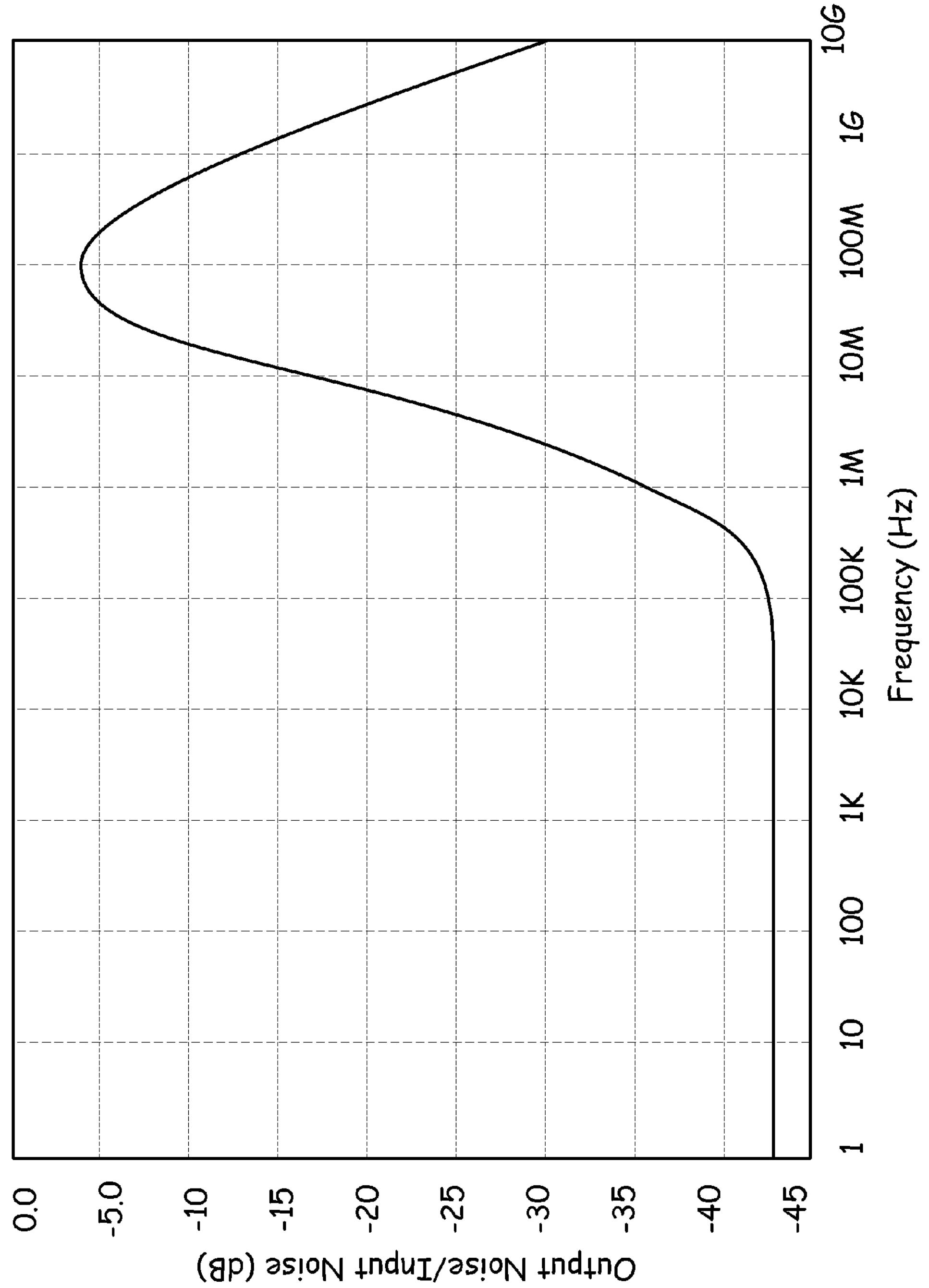
Fig. 4 (Prior Art)
FIG. 4 is a chart depicting the ratio of voltage regulator output noise to external supply input noise for a prior art PMOS-type pass transistor low-dropout regulator.
Figure 7:
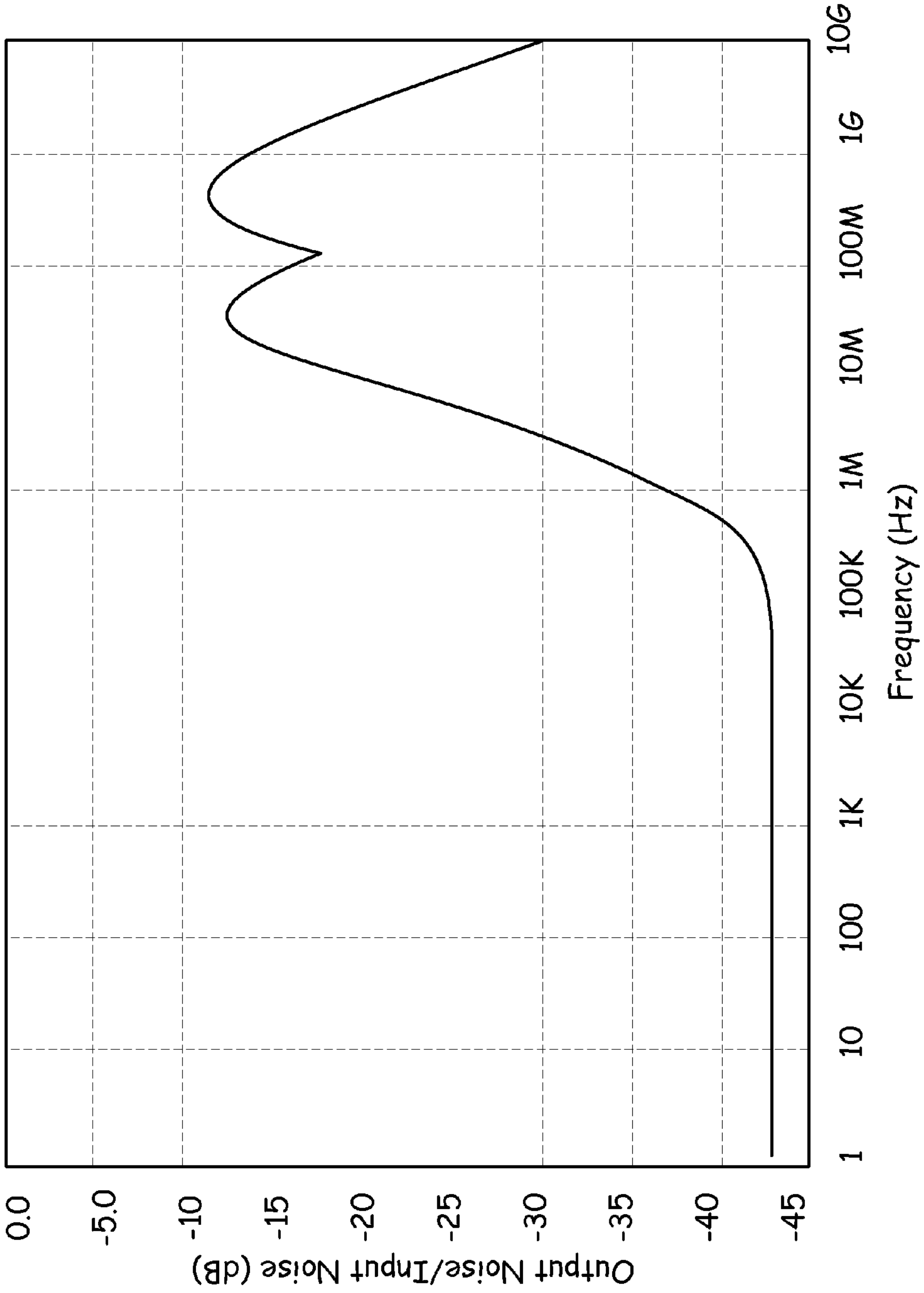
FIG. 7 is a chart depicting the ratio of voltage regulator output noise to external supply input noise for the PMOS-type low-dropout regulator of FIG. 5, according to an embodiment of the present invention.

FIG. 7 depicts the effect of this power supply noise injection. As can be seen in FIG. 7, power supply noise injection improves the regulator's peak power supply rejection ratio to about −10.6 decibels at about 100 megahertz, where the prior art curve of FIG. 4 has a peak. Thus, more than about six decibels of improvement is achieved by simply adding a power supply noise injection capacitor into the circuit. The value of the capacitor and its exact location can be optimized to provide the regulator with increased immunity from noise on its external power supply over a particular frequency range.

The foregoing description of embodiments for this invention has been presented for purposes of illustration and description. It is not intended to be exhaustive nor to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for reducing noise in an output of a voltage regulator only at frequencies above a closed loop bandwidth, by providing a noise injection path for injecting external noise into the voltage regulator, where the noise injection path only becomes active at the frequencies above the closed loop bandwidth, where the noise injection path reduces the noise in the output of the voltage regulator.

2. The method of claim 1, wherein the noise injection path comprises a capacitor.

3. The method of claim 1, wherein the noise comprises in-phase noise.

4. The method of claim 1, wherein the voltage regulator is a linear regulator.

5. The method of claim 1, wherein the noise is injected into a gate of a pass transistor of the voltage regulator.

6. The method of claim 1, wherein the noise injection path comprises a capacitor to inject in-phase noise into the voltage regulator.

7. The method of claim 1, wherein the voltage regulator is a linear regulator and the noise injection path comprises a capacitor to inject in-phase noise into a gate of a pass transistor of the voltage regulator.

8. A method for reducing noise in an output voltage of a power supply, the method comprising injecting in-phase noise into a gate of a pass transistor of a linear regulator only at frequencies above a closed loop bandwidth of the linear regulator, thereby causing source and gate voltages of the pass transistor to vary at a common phase and cancel each other out.

9. In a voltage regulator, the improvement comprising circuitry that injects in-phase noise into a gate of a pass transistor of the voltage regulator only at frequencies above a closed loop bandwidth of the voltage regulator, thereby causing source and gate voltages of the pass transistor to vary at a common phase and cancel each other out.

10. The voltage regulator of claim 9, wherein the circuitry comprises a capacitor.

11. The voltage regulator of claim 9, wherein the voltage regulator is a linear regulator.

12. The voltage regulator of claim 9, wherein the voltage regulator is a linear regulator and the noise injection path comprises a capacitor.

* * * * *